(12) United States Patent
Chen et al.

(10) Patent No.: US 12,105,567 B2
(45) Date of Patent: Oct. 1, 2024

(54) LIQUID COOLING ASSEMBLY

(71) Applicants: Inventec (Pudong) Technology Corporation, Shanghai (CN); INVENTEC CORPORATION, Taipei (TW)

(72) Inventors: Xuefeng Chen, Shanghai (CN); Pin-Yi Xiang, Shanghai (CN); Lisheng Wang, Shanghai (CN); Yi-Dong Ji, Shanghai (CN); Yanhua Shi, Shanghai (CN); Yang Ying, Shanghai (CN); Xiaowei Zhang, Shanghai (CN)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 256 days.

(21) Appl. No.: 17/839,756

(22) Filed: Jun. 14, 2022

(65) Prior Publication Data
US 2023/0273657 A1   Aug. 31, 2023

(30) Foreign Application Priority Data

Feb. 28, 2022 (CN) .......................... 202210188970.3

(51) Int. Cl.
*F28F 7/00* (2006.01)
*G06F 1/20* (2006.01)

(52) U.S. Cl.
CPC ...................... *G06F 1/20* (2013.01)

(58) Field of Classification Search
CPC .......................................................... G06F 1/20
USPC .......................................... 165/80.4
See application file for complete search history.

(56) References Cited

U.S. PATENT DOCUMENTS

2008/0098898 A1\* 5/2008 Lai ..................... B01D 19/0031
                                                            96/243
2011/0079376 A1\* 4/2011 Loong ..................... B01D 8/00
                                                            165/185

\* cited by examiner

*Primary Examiner* — Davis D Hwu
(74) *Attorney, Agent, or Firm* — Locke Lord LLP; Tim Tingkang Xia, Esq.

(57) ABSTRACT

This disclosure relates to a liquid cooling assembly that includes a base, a cover, a first connector, and a second connector. The cover is disposed on the base. The cover and the base together form an accommodation space therebetween. The cover has an inlet and an outlet respectively located at two opposite sides of the cover in a direction parallel to a longitudinal direction of the cover. The first connector is disposed to the inlet of the cover. The second connector is disposed to the outlet of the cover.

9 Claims, 3 Drawing Sheets

LIQUID COOLING ASSEMBLY

CROSS-REFERENCE TO RELATED APPLICATIONS

This non-provisional application claims priority under 35 U.S.C. § 119(a) on Patent Application No(s). 202210188970.3 filed in China, P.R.C. on Feb. 28, 2022, the entire contents of which are hereby incorporated by reference.

BACKGROUND OF THE INVENTION

Technical Field of the Invention

The present disclosure relates to a heat dissipation assembly, more particularly to a liquid cooling assembly.

Description of the Related Art

Computers are indispensable in daily life. A computer generally has electronic devices, such as central processing unit and graphic processing unit, for achieving the required functions. These devices will generate heat during operation. If the heat is not efficiently dissipated, the internal temperature of the computer will be increased and thereby affecting or damaging the electronic devices and nearby components.

Liquid-cooling is known a more efficient solution for heat dissipation compared to air-cooling. However, the performance of the conventional liquid-cooling systems are becoming unable to match the increasing amount of heat generated by the central processing units and graphic processing units as these heat sources advance.

SUMMARY OF THE INVENTION

The present disclosure provides a liquid cooling assembly capable of efficiently dissipating heat generated by a heat source such as a central processing unit.

According to one aspect of the present disclosure, a liquid cooling assembly that includes a base, a cover, a first connector, and a second connector. The cover is disposed on the base. The cover and the base together form an accommodation space therebetween. The cover has an inlet and an outlet respectively located at two opposite sides of the cover in a direction parallel to a longitudinal direction of the cover. The first connector is disposed to the inlet of the cover. The second connector is disposed to the outlet of the cover.

According to the liquid cooling assembly discussed above, the inlet and the outlet are respectively located at two opposite sides of the cover, making the coolant become more effective in dissipating heat from the base and thereby improving the heat dissipation efficiency of the liquid cooling assembly.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
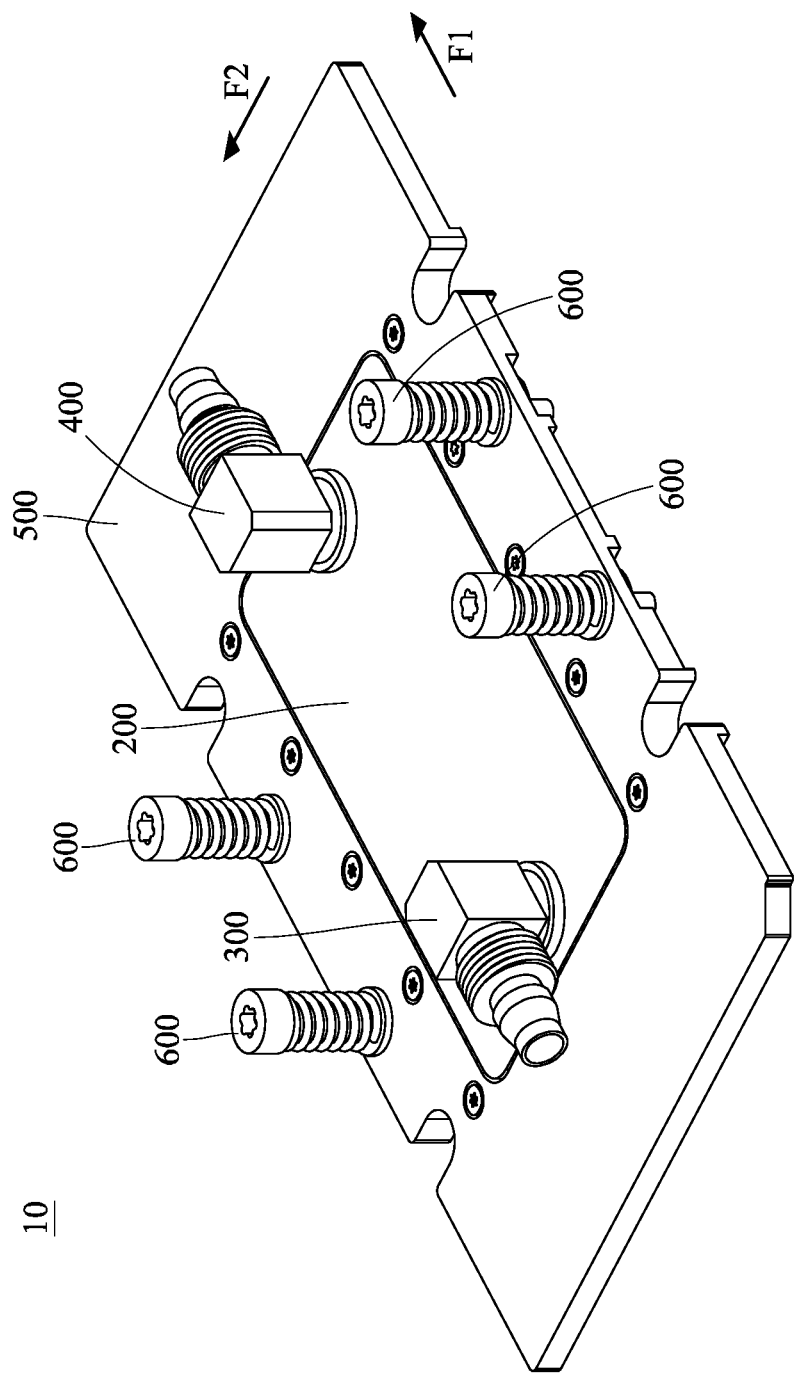
FIG. 1 is a perspective view of a liquid cooling assembly according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
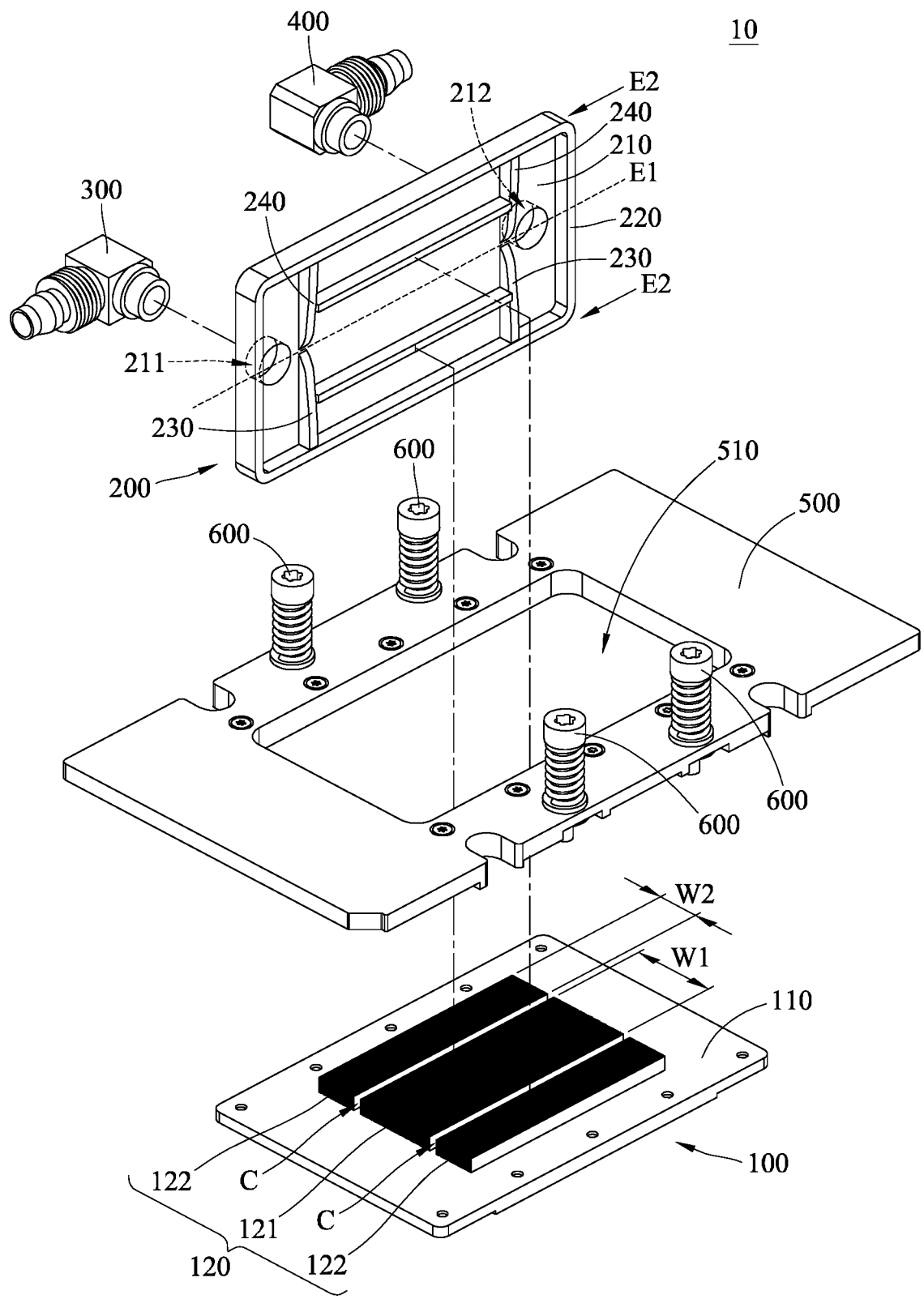
FIG. 2 is an exploded view of the liquid cooling assembly in FIG. 1.
Figure 3:
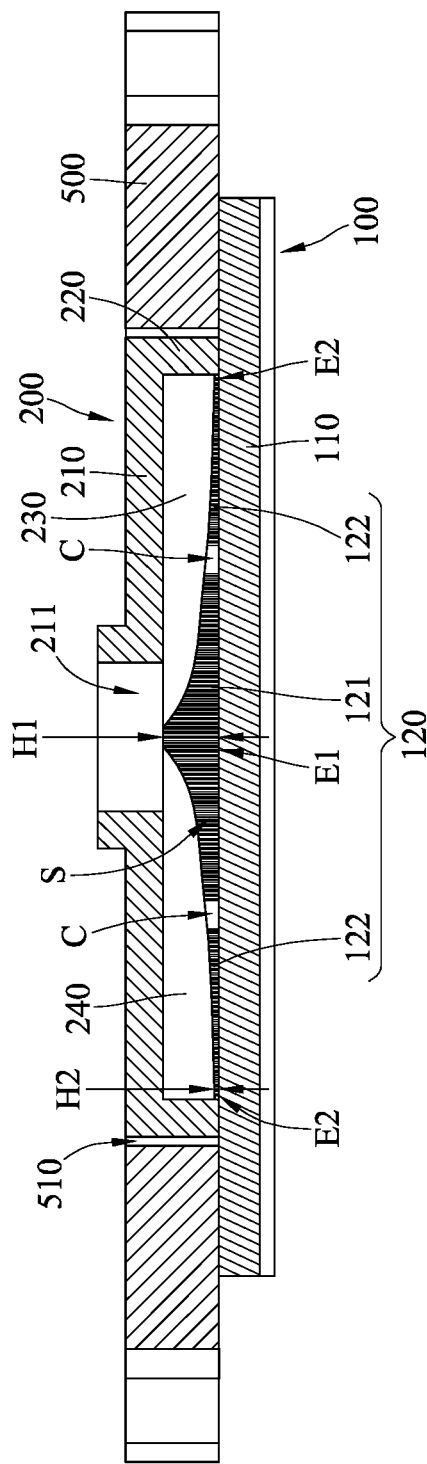
FIG. 3 is a cross-sectional view of the liquid cooling assembly in FIG. 1.

Please refer to FIG. 1 to FIG. 3, where FIG. 1 is a perspective view of a liquid cooling assembly according to a first embodiment of the present disclosure, FIG. 2 is an exploded view of the liquid cooling assembly in FIG. 1, and FIG. 3 is a cross-sectional view of the liquid cooling assembly in FIG. 1.

One embodiment of the present disclosure provides a liquid cooling assembly 10 including a base 100, a cover 200, a first connector 300, and a second connector 400. The cover 200 is disposed on the base 100. The cover 200 and the base 100 together form an accommodation space S therebetween for accommodating coolant (not shown). The cover 200 has an inlet 211 and an outlet 212 which are respectively located at two opposite sides of the cover 200 and arranged in a direction parallel to the longitudinal direction F1 of the cover 200.

In detail, the base 100 includes a substrate 110 and a plurality of fins 120. The plurality of fins 120 protrude from the substrate 110 and are located in the accommodation space S. The plurality of fins 120 extend along directions parallel to the longitudinal direction F1 of the cover 200. The plurality of fins 120 include a first group 121 and two second groups 122. The first group 121 is located between the second groups 122, and the first group 121 is spaced apart from each of the second groups 122 by a channel C.

In this embodiment, the first group 121 has a width W1 greater than a width W2 of each second group 122, but the present disclosure is not limited thereto. In some other embodiments of the present disclosure, the width of the first group may be less than the width of each second group.

The cover 200 includes a plate 210, a plurality of lateral walls 220, two baffles 230, and two baffles 240. The inlet 211 and the outlet 212 are located on the plate 210. The inlet 211 and the outlet 212 are respectively located at two opposite sides of the plate 210 in a direction parallel to the longitudinal direction F1 of the cover 200 and are located on the middle reference line E1 of the cover 200 in a direction parallel to the width direction F2 of the cover 200. The plurality of lateral walls 220 are connected to edges of the plate 210. The baffles 230 and 240 protrude from the plate 210 and are located in the accommodation space S. The baffles 230 and 240 extend along directions parallel to the width direction F2 of the cover 200 and have heights gradually decreasing towards the middle reference line E1 from the outer sides E2 of the cover 200 in directions parallel to the width direction F2 of the cover 200. As a result, parts of the accommodation space S at the baffles 230 and 240 have heights gradually increasing towards the middle reference line E1 from the outer sides E2 of the cover 200 in directions parallel to the width direction F2 of the cover 200. That is, the parts of the accommodation space S at the baffles 230 and 240 have a height H1 on the middle reference line E1 greater than a height H2 at each outer side E2.

The first connector 300 is disposed to the inlet 211 of the cover 200. The second connector 400 is disposed to the outlet 212 of the cover 200. It can be considered that the first connector 300 and the second connector 400 are located on the middle reference line E1 of the cover 200.

In this and some embodiments of the present disclosure, the liquid cooling assembly 10 may further include a frame 500 and a plurality of fasteners 600. The frame 500 has an opening 510. The frame 500 is stacked on the substrate 110 of the base 100, and the cover 200 and the fins 120 are located in the opening 510 and therefore are surrounded by the frame 500. The fasteners 600 are rotatably disposed on the frame 500. For example, the fasteners 600 may be screws for the fixation of the frame 500 to a motherboard (not shown), such that the base 100 of the liquid cooling assembly 10 is able to be in thermal contact with a heat source (not shown, e.g., a central processing unit) on the motherboard.

According to the liquid cooling assembly discussed above, the inlet and the outlet are respectively located at two opposite sides of the cover, making the coolant become more effective in dissipating heat from the base and thereby improving the heat dissipation efficiency of the liquid cooling assembly.

Moreover, the arrangement of the baffles define an accommodation space whose height gradually decreases from central portion towards two opposite ends, thus the flow rate of the coolant is the highest at the middle reference line and gradually decreases towards two outer sides along the baffles and thereby enhancing heat exchange between coolant and the liquid cooling assembly.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A liquid cooling assembly, comprising:
a base;
a cover disposed on the base, wherein the cover and the base together form an accommodation space therebetween, and the cover has an inlet and an outlet respectively located at two opposite sides of the cover and arranged in a direction parallel to a longitudinal direction of the cover;
a first connector disposed to the inlet of the cover;
a second connector disposed to the outlet of the cover, and
a frame, stacked on the base and surrounding the cover.

2. The liquid cooling assembly according to claim 1, further comprising a plurality of fasteners rotatably disposed on the frame.

3. The liquid cooling assembly according to claim 1, wherein the base comprises a substrate and a plurality of fins, and the plurality of fins protrude from the substrate and are located in the accommodation space.

4. The liquid cooling assembly according to claim 3, wherein the plurality of fins extend along directions parallel to the longitudinal direction of the cover.

5. The liquid cooling assembly according to claim 3, wherein the plurality of fins comprises a first group and two second groups, the first group is located between the second groups, and the first group is spaced apart from each of the second groups by a channel.

6. The liquid cooling assembly according to claim 5, wherein the first group has a width greater than a width of each of the second groups.

7. The liquid cooling assembly according to claim 1, wherein a part of the accommodation space has a height gradually increasing towards a middle reference line from outer sides of the cover in directions parallel to a width direction of the cover.

8. The liquid cooling assembly according to claim 7, wherein the first connector is located on the middle reference line of the cover in a direction parallel to the width direction of the cover.

9. The liquid cooling assembly according to claim 8, wherein the second connector is located on the middle reference line of the cover in a direction parallel to the width direction of the cover.

* * * * *